(12) United States Patent
Chen et al.

(10) Patent No.: US 7,079,960 B2
(45) Date of Patent: Jul. 18, 2006

(54) AUTO CLASSIFICATION SHIPPING SYSTEM

(75) Inventors: Yu-Chih Chen, Taipei (TW); Remaerd Hsieh, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 640 days.

(21) Appl. No.: 10/286,625

(22) Filed: Nov. 2, 2002

(65) Prior Publication Data

US 2004/0088074 A1 May 6, 2004

(51) Int. Cl.
*G01R 15/00* (2006.01)
*G06F 19/00* (2006.01)

(52) U.S. Cl. ....................................................... 702/57
(58) Field of Classification Search ................... 702/57
See application file for complete search history.

(56) References Cited

U.S. PATENT DOCUMENTS

| | | | |
|---|---|---|---|
| 5,788,084 A * | 8/1998 | Onishi et al. ................ | 209/573 |
| 5,831,856 A | 11/1998 | Lin | |
| 5,901,153 A | 5/1999 | Chuang | |
| 6,434,725 B1* | 8/2002 | Sommer et al. ................ | 716/4 |
| 2003/0014205 A1* | 1/2003 | Tabor .......................... | 702/84 |
| 2003/0034280 A1* | 2/2003 | Jung .......................... | 209/573 |

* cited by examiner

*Primary Examiner*—Bryan Bui
*Assistant Examiner*—Demetrius Pretlow
(74) *Attorney, Agent, or Firm*—Haynes and Boone, LLP (57) ABSTRACT

A new method and system of testing and classifying semiconductor devices is provided. User requirements are collected for this purpose, test specifications and test functions are defined for the to be tested DRAM devices. The Automatic Classification Shipping (ACS) data base is updated with test related data, the testing is performed whereby DRAM devices are assigned categories from with DRAM classes are derived. These identified classes are used to sort the tested DRAM devices in accordance with their tested functional performance characteristics.

44 Claims, 7 Drawing Sheets

CHIP CLASSIFICATION

| Chip no | Category 1 | 2 | 3 | 4 | 5 | 6 | 7 | 8 | ... | n | Summary | Class |
|---|---|---|---|---|---|---|---|---|---|---|---|---|
| 1 | 0 | 2 | 5 | 11 | 3 | 0 | 0 | 0 | ... | 0 | 21 | B |
| 2 | 1 | 0 | 0 | 0 | 0 | 1 | 0 | 0 | ... | 0 | 2 | A |
| 3 | 2 | 4 | 3 | 7 | 1 | 0 | 1 | 2 | ... | 2 | 20 | B |
| 4 | 11 | 2 | 4 | 1 | 3 | 0 | 22 | 1 | ... | 1 | 44 | B |
| 5 | 21 | 3 | 7 | 4 | 22 | 7 | 8 | 1 | ... | 1 | 73 | C |
| 6 | 23 | 3 | 11 | 22 | 18 | 10 | 6 | 3 | ... | 3 | 96 | D |

FIG. 5

WAFER CLASSIFICATION

| Wafer | Chip 1 | 2 | 3 | 4 | 5 | 6 | 7 | ... | n | Summary | Class |
|---|---|---|---|---|---|---|---|---|---|---|---|
| 1 | B | A | A | B | B | C | B | ... | B | A:63% B:12% C: 9% D:11% | A |
| 2 | A | B | C | A | B | B | A | ... | B | A:21% B:62% C: 8% D: 9% | B |
| 3 | A | C | A | B | A | A | A | ... | A | A:55% B:23% C:12% D:10% | A |
| 4 | A | B | C | B | B | B | A | ... | A | A:21% B:62% C: 8% D: 9% | B |
| 5 | C | C | A | D | C | B | C | ... | C | A:21% B: 8% C:62% D: 9% | C |
| 6 | D | D | B | D | D | B | D | ... | D | A: 9% B: 8% C:21% D:62% | D |
| 7 | E | D | E | E | B | D | E | ... | E | A: 9% B: 8% C:10% | E |

FIG. 6

LOT CLASSIFICATION

| LOT no | WAFER | | | | | | | Class A | Class B | Class C | Class D |
|---|---|---|---|---|---|---|---|---|---|---|---|
| | 1 | 2 | 3 | 4 | | | n | | | | |
| 1 | A | A | A | A | | ··· | A | 463 | 201 | 53 | 17 |
| 2 | A | A | A | A | | ··· | A | 393 | 123 | 64 | 78 |
| 3 | B | B | B | B | | ··· | B | 23 | 364 | 51 | 47 |
| 4 | C | C | C | C | | ··· | C | 17 | 21 | 213 | 14 |
| 5 | D | D | D | D | | ··· | D | 27 | 18 | 9 | 321 |

FIG. 7

AUTO CLASSIFICATION SHIPPING SYSTEM

BACKGROUND OF THE INVENTION (1) Field of the Invention

The invention relates to the fabrication of integrated circuit devices, and more particularly, to a method and system that provides automatic support for classification of outgoing DRAM product. Automatic lot splitting and lot is performed in a Manufacturing Information System (MIS) based on test results.

(2) Description of the Prior Art

For typical DRAM test purposes, as detailed in U.S. Pat. No. 5,831,856 (Lin), a Dynamic Random Access Memory (DRAM) testing apparatus is used that includes a substantially upright support plate on which at least one elongated feeding chute is provided, having a channel co-extensive therewith for receiving and holding therein an IC bar, which contains a number of DRAM devices to be tested. The DRAM devices are moved down along the channel by means of gravity. A shifting mechanism, which is controlled by a control unit, sequentially transfers the DRAM devices from the feeding chute to a testing device, defining a holder for receiving the DRAM device to carry out the test. The tests are conducted by the control unit, the test results are transmitted thereto for classification of the DRAM devices being tested. The tested DRAM devices are then forwarded to a movable member to be conveyed thereby to one of a plurality of out-feeding chutes, which are associated with different classifications of the DRAM devices. The DRAM devices are then moved from the out-feeding chute to an empty IC bar to be collected therein.

U.S. Pat. No. 5,901,153 (Chuang) provides a DRAM classification method, which includes a test and classification apparatus that is controlled by a test and classification control process. The test and classification apparatus includes a programmable logic control (PLC) unit, test devices, a conveyer device, electromagnetic driver devices, a man-machine interface, sensors and an alarm. The PLC is operated in accordance with the test and classification process to control the test devices for performing tests on the DRAM devices supplied by at least two supply rails. The electromagnetic driver devices are then used to move the DRAM devices so tested to the conveyer device, which in turn conveys the DRAM devices to a particular collection position in accordance with the characteristic values obtained in the test, which characteristic values being within a particular class of DRAM device associated with a particular collection position, to achieve conveyance and classification of the DRAM device. The man-machine interface provides a manual control and access to the steps of the test and classification control process of the DRAM device. The sensors and the alarm are to detect the condition of out-of-supply of DRAM devices, and to provide a warning of the out-of-supply condition.

The invention teaches an Automatic Classification Shipping (ACS) system that is applied to DRAM devices. The objective of the ACS system of the invention is to automatically classify DRAM devices for purposes of shipment of these devices. This classification can comprise categories of for instance good devices, devices that are functional for certain applications, and the like. The functionality of the ACS is broken down into three categories, that is the function of Classification of the DRAM devices, the function of splitting of the DRAM devices into sub-groups and the function of Combining lots of DRAM devices.

SUMMARY OF THE INVENTION

A principle objective of the invention is to automatically classify DRAM devices in preparation of shipment of these devices.

Another objective of the invention is to provide for the creation of set-up criteria that allow automatic classification of DRAM devices.

Yet another objective of the invention is to provide for splitting lots of tested DRAM devices in accordance with test results.

A still further objective of the invention is to provide for combining lots of tested DRAM devices based on classification of class or fail reason.

In accordance with the objectives of the invention a new method and system of testing and classifying semiconductor devices is provided. User requirements are collected for this purpose, test specifications and test functions are defined for the to be tested DRAM devices. The Automatic Classification Shipping (ACS) database is updated with test related data, the testing is performed whereby DRAM devices are assigned categories from which DRAM classes are derived. These identified classes are used to sort the tested DRAM devices in accordance with their tested functional performance characteristics.

DESCRIPTION OF THE PREFERRED EMBODIMENTS

The following are basic principles that are used by the invention with the objective of providing an automatic classification capability that can be used in support of a chip shipping operation.

Semiconductor chips, in this instance specifically DRAM devices, are created over the surface of semiconductor wafers, one wafer comprising a multiplicity of DRAM chips Wafers are, from a manufacturing processing point of view, handled in lots of wafers, each lot comprising a multiplicity of wafers, typically 25 per lot Chips that are created over the surface of a wafer can be tested by either testing all chips, hereby referred to as Wafer Acceptance Test (WAT), or by selectively testing a subset of the chips created over the surface of the wafer, hereby referred to as Multiple Probe (MP) chip testing Test criteria are the test conditions or test stimuli that are applied to a chip for purposes of testing the chip, there are multiple tests that can be applied to a chip resulting in multiple test criteria for a chip From the test criteria, the invention derives a test category for a chip, which refers to a method of the invention that indicates whether a chip is, for a particular test (test criteria), tested to fall within the limits of the parameter for that test criteria (the chip passes that test), above these limits (the chip is tested high for that test) or below these limits (the chip is tested low for that test)

Based on the test category the invention determines a weight point for each chip that has been tested, a test category therefore has a weight point associated therewith The weight points for all test categories are, after the test of the chip has been completed, added, this sum of all weight points is converted into the class of the chip After testing of the chips has been completed, the tested chips are sorted in accordance with the class parameter of the tested chips The weight point that is determined by the invention can further be modified or "based" to get the final classification results for each chip that has been tested The invention allows for but is not limited to the categorization of chips in five classes, that is a class A for chip of best performance, a class B for chips of good performance, a class C for chips that can be used, a class D for chips that perform marginally and a class E for chips that are rejected; the relative criteria of "best", "good", "can be used" and "marginally" are determined by the weight points that are calculated by the invention for the chips that are being tested, this will be explained in further detail at a later time The classes and the weight points that are calculated for the chips correlate as follows:
1. Class A: 1–5 weight points
2. Class B: 6–49 weight points
3. Class C: 50–95 weight points
4. Class D: 95–99 weight points, and
5. Class E: over 99 weight points.

For each chip that has been created over the surface of a wafer, a total of "n" categories may exist whereby, as stated above, a category is calculated by the invention based on a particular test and the test results that have been obtained (for that chip/test); for each category the invention calculates, as stated above, a weight point From the preceding statement it is clear that a chip has a total of "n" weight points, these "n" weight points are summarized and result in a summary number of weight points for a given chip, this summary number is converted into the class of the tested chip For a given number of chips that have been created over the surface of a wafer, an equal number of summary numbers of weight points is created by the invention; each of these numbers is then assigned to one of the classes A, B, etc. based on the summary number of the weight points for a given chip.

For instance, a chip may have a sequence of weight points 1, 0, 0, 2 and 5 calculated by the invention for a sequence of categories of category 1 through 5, the total number of weight points is 8 meaning that this chip will be assigned to class B as specified above A lot comprises a number of wafers, typically between 1 and 25, a lot has a unique serial number, for example R60001.01. A wafer lot can be represented by the following notation: LOT no.(BLOCK 57, BLOCK 71 WAFER DATA)

A wafer is a combination of a number of chips, a wafer has a unique serial number; chips are referenced within a wafer by X and Y-axis locations, for example R60001.01, R60001.02–R60001.25

A chip can be represented by the following notation: Chip no. (BLOCK 45, BLOCK 61 CHIP DATA); each chip has a unique serial number on a wafer, the X-axis/Y-axis location algorithm for a chip is as follows: location value=X*256+Y, for instance: X,Y=(1,10) results in a location value of 1*256+10=0266, or X,Y=(23,123) results in a location value of 23*256+23=5911.

A category can be represented with the following notation: Category no. (BLOCK 43 CATEGORY DATA)

A product is associated with a device type and defines a device with test functions and test parameters, the test parameters belonging to a Category no., SPECHI AND SPECLO values are associated with each parameter The SPECHI parameter is an upper limit value within a Category The SPECLO parameter is a lower limit value within a Category Since the algorithm for the calculation of the weight points is central to the invention, this algorithm will be explained next.

The following parameters are used:
1. the variable "i" is used as a variable designating a chip created over the surface of a wafer, the number of chips created over the surface of a wafer varies from "1" through "m"
2. each chip is subjected to a number of tests by applying test conditions (test criteria) to the device under test (DUT), the number of the test that is performed is indicated with the variable "j", the number of tests that are applied to a chip "i" varies from "1" through "n"
3. for each test that is performed on a chip, a category is calculated, the variable "j" is therefore also used for the category since the number of the calculated category is equal to the number of the test that is performed of the DUT, a maximum of "n" categories is therefore calculated for a chip "i" that is being tested
4. Y[i,j] represents a calculated weight point for chip "i" and test "j" performed on this chip
5. Θ[j] is a fail range by category, this parameter is a biasing parameter that is used to shift the distribution of the calculated values of Y[i,j]
6. The parameter "value[j]" is the measured value for a test "j"
7. The parameter "spechi[j]" is the specification high ("spech-hi") limit of a test "j", and
8. The parameter "speclo[j]" is the specification low ("spec-lo") limit of a test "j".

In the testing of a chip, three conditions of the value of "value[j]" relative to the value of "spechi[j]" and the value of "speclo[j]" are possible for a test "j":
1. value[j]≦speclo[j], the tested value is lower than the low limit of the tested parameter
2. speclo[j]≦value[j]≦spechi[j], the tested value is within the limits of the tested parameter, and
3. value[j]>spechi[j], the tested value is higher than the upper limit of the tested parameter.

In testing one chip "i", applying one test condition (test criteria) "j" to the chip, the following algorithm is applied to calculate Y[i,j] in each of the three possible cases, as follows:
1. for value[j]≦speclo[j], in this case Y[i,j]=|(value[j]−speclo[j])/speclo[j]|−Θ[j]
2. for speclo[j]≦value[j]≦spechi[j], in this case Y[i,j]=0, and
3. for value[j]>spechi[j], in this case Y[i,j]=|(value[j]−spechi[j])/spechi[j]|−Θ[j].

Further extending this concept, now realizing that the chip "i" is subjected to "n" tests (categories) whereby the sequential test number is the variable "j", the summation of the calculated values for Y[i,j] for all the "n" tests that are performed on the chip "i" is as follows, with for all cases the variable "j" varying from j=1 through j=n:
1. for value[j]≦speclo[j], in this case $Y[i,j]=\Sigma|(value[j]-speclo[j])/speclo[j]|-\Theta[j]$
2. for speclo[j]≦value[j]≦spechi[j], in this case $Y[i,j]=0$, and
3. for value[j]>spechi[j], in this case $Y[i,j]=\Sigma|(value[j]-spechi[j])/spechi[j]|-\Theta[j]$.

Further extending this concept yet, it is realized that multiple values for Y[i,j] relating to multiple chips that are being tested by varying the variable "i" from a value of "1" to a value "m" that equals the maximum number of chips that are being tested. The above concepts can be more readily understood by consulting FIG. 5, the Chip classification Table.

While the above presented equations may on first sight appear forbidding a closer look will reveal the following:
1. for chips that test within limits, the value of Y[i,j] is not augmented, a low value of Y[i,j] for a chip therefore indicates that the chip tests good for all tests that are applied to the chip, and
2. for chips that test out-off limits, each of these out-off limits tests contributes to increasing the value of Y[i,j], the magnitude of this increase is proportional to how far the test result deviates from the test limits (by subtracting the spec limit from the measured value) and is further calculated as being dependent on the value of the upper or lower limit of the test (by dividing the indicated difference between the spec limit and the measured value by the spec limit).

From the above highlighted points relating to the calculation of the value of Y[i,j] it is clear that this parameter provides a method to control how well chips are performing with respect to certain test limits and to additionally select good chips and sort the remaining chips to varying degrees of usefulness or applicability of the chips.

Figure 1A:
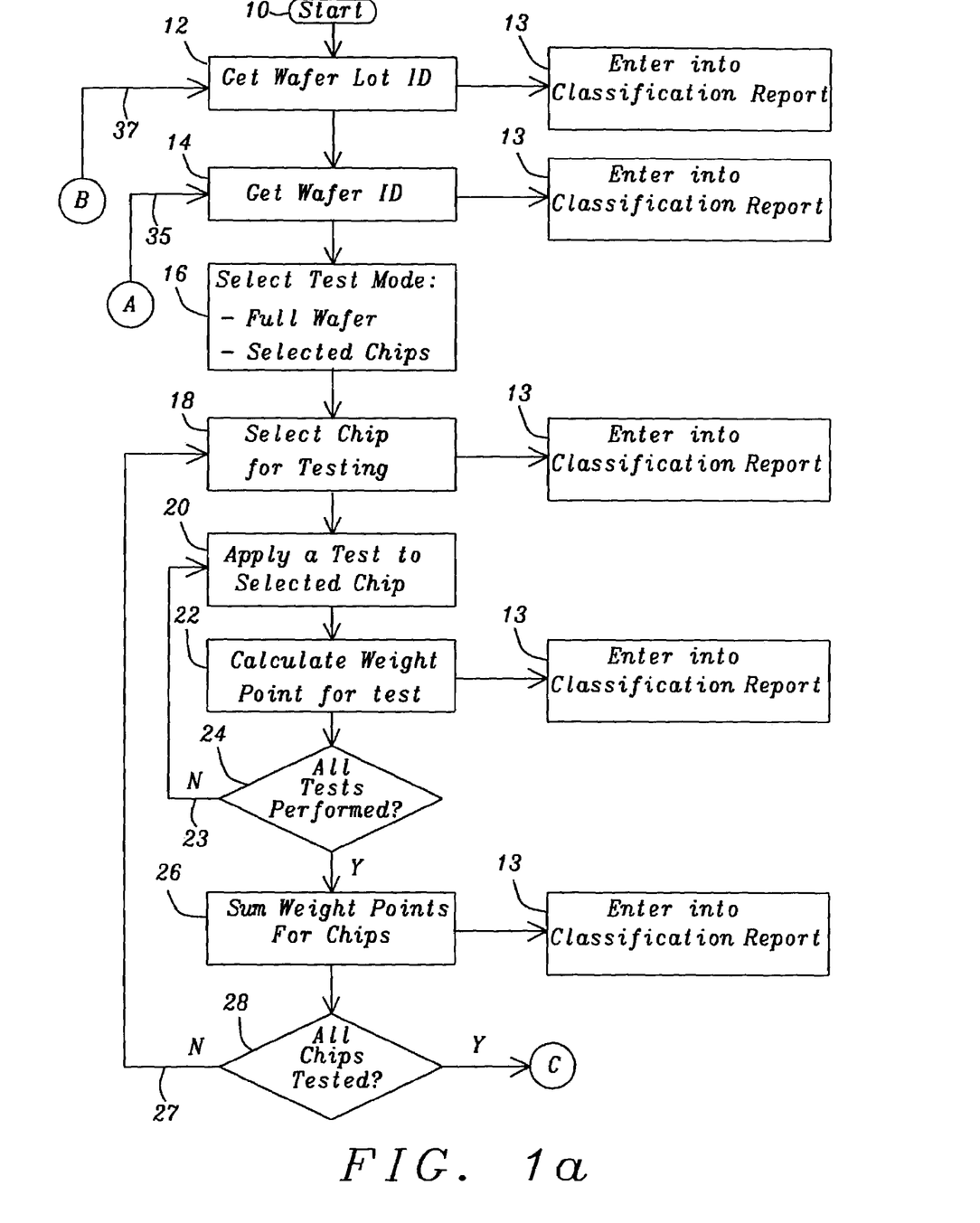
FIGS. 1a and 1b show a flowchart of the method of the invention.
Figure 1B:
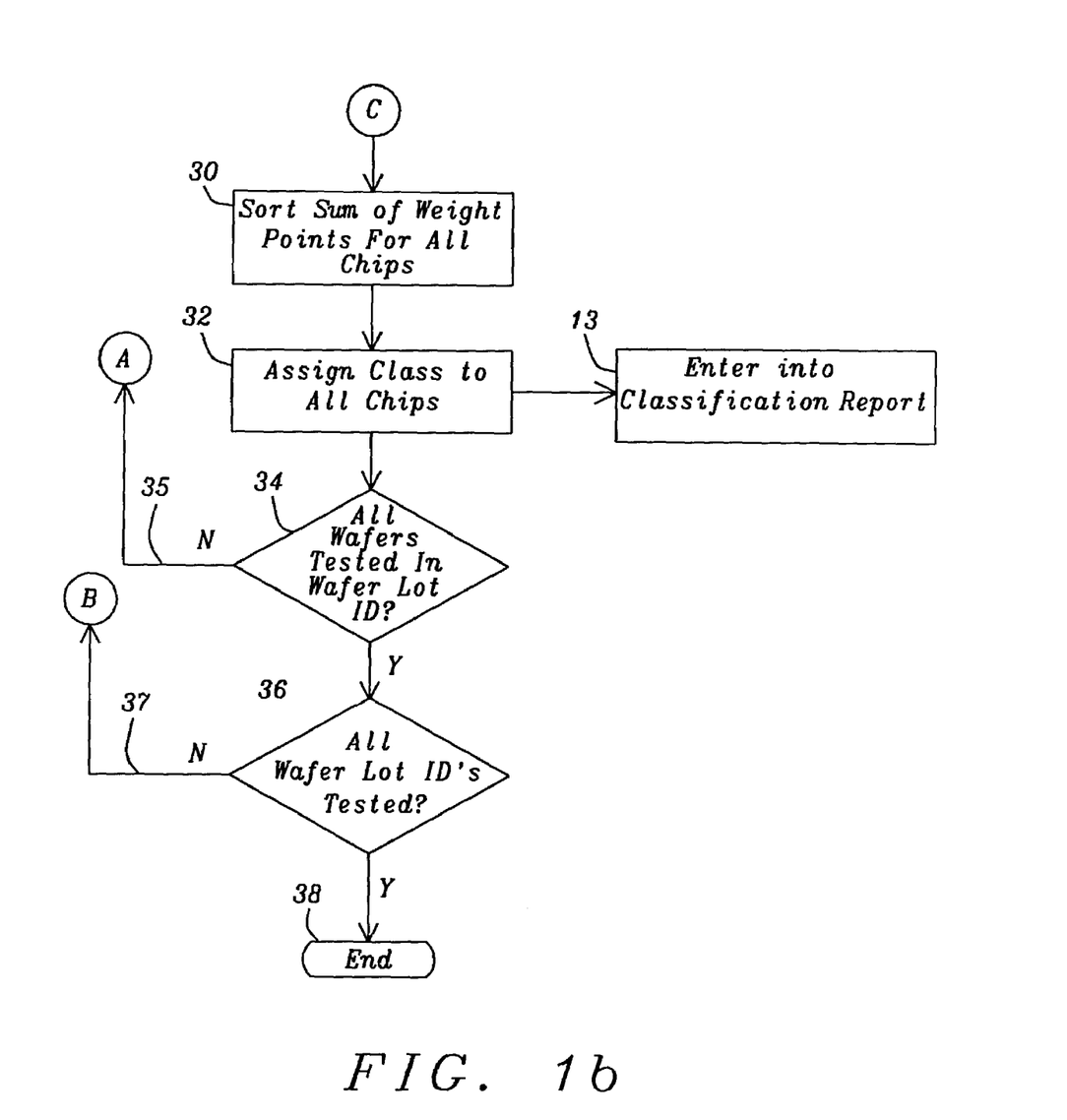
Figure 7:
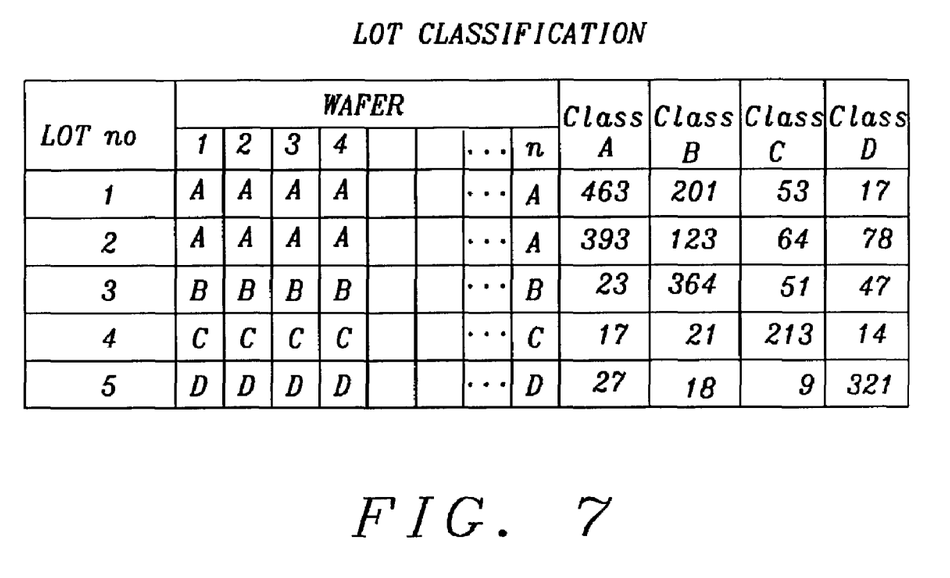

The implementation of the previously highlighted methods of chip analysis is further summarized and highlighted using the flowchart that is shown in FIG. 1, the following steps are highlighted in the flowchart of FIG. 1:

10, start execution of the software routine of the invention, this step typically represents a branch into this routine that is issued by a higher level semiconductor manufacturing control system such as an Manufacturing Information System (MIS) or a similar function 12, a wafer lot is selected; this selection typically comprises accessing a data base that is under control of a MIS or a similar supervisory control system 13, entries that are made for purposes of creating a report that reflects the ongoing activities have collectively been highlighted as entries 13; in the first instance of the highlighted block 13 the wafer Lot ID is entered into a report that reflects the ongoing activities and that is referred to as a Lot Classification report, see FIG. 7

Figure 6:
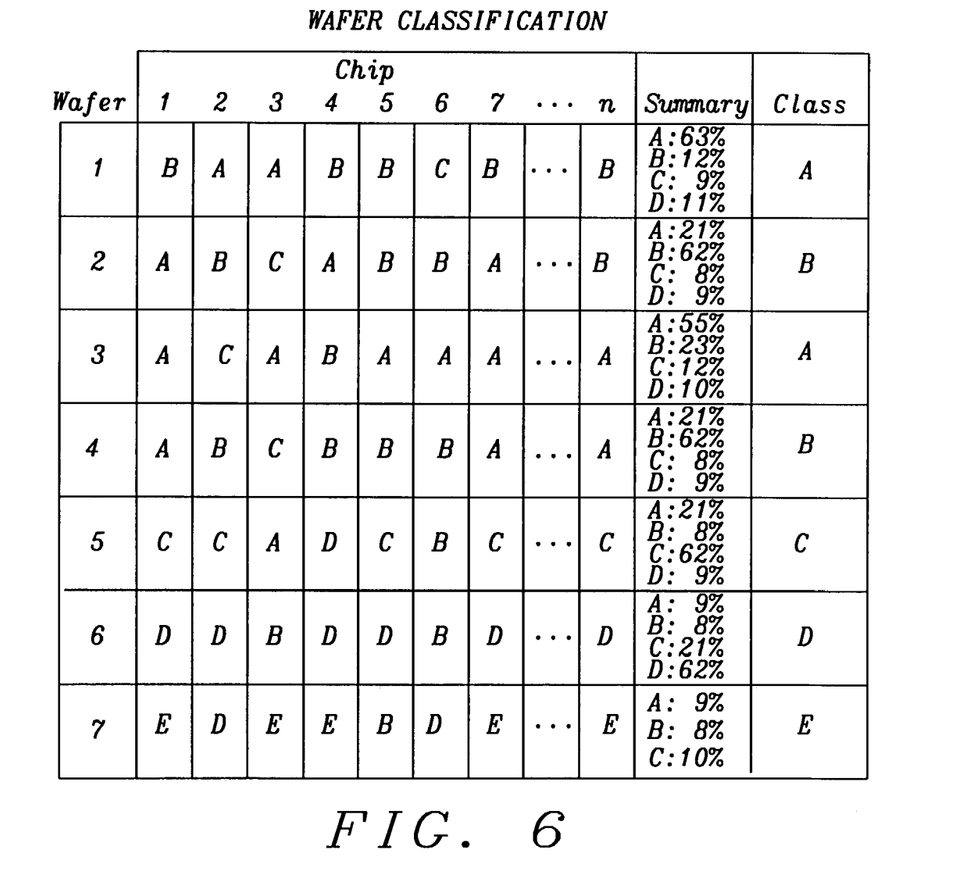

14, get a wafer ID of a wafer that belongs to the accessed wafer lot ID, enter this wafer ID into the Lot Classification report, see FIG. 7, further enter this wafer ID into the Wafer Classification report, see FIG. 6

Figure 5:
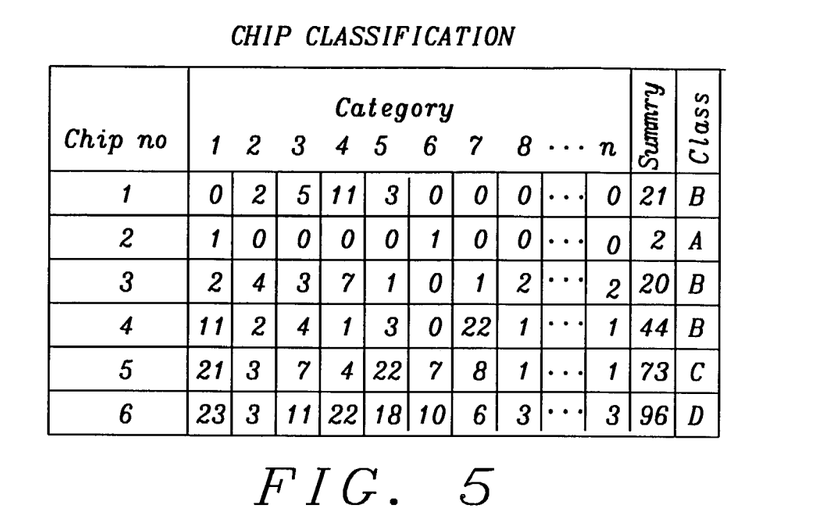

16, select the test mode that is applied, that is are all chips on the selected wafer to be tested or is a subset of the chips on the selected wafer ID to be tested; for either selection, at least one chip is being tested 18, select a chip for testing, enter the selected chip (chip ID) into the Wafer Classification report (FIG. 6) and into the Chip Classification Report (FIG. 5)

20, apply a test to the selected chip 22, calculate the weight point Y[i,j] for the test that has been applied in accordance with the above provided algorithms, enter the calculated Y[i,j] into the Chip Classification report (FIG. 5)

24, if not all tests have been applied to the chip, branch 23, select a next test 26, if all tests have been applied, calculate the sum of the Y[i,j] for that chip, enter the calculated sum Y[i,j] into the Chip Classification report (FIG. 5)

28, if not all chips within the wafer ID have been tested, branch 27, select the next chip to be tested 30, if all chips have been tested in the selected wafer ID, sort the calculated sum Y[i,j] for all chips that have been tested within the selected wafer ID 32, assign a class, such as class A, B, etc. to the sorted sum Y[i,j]

34, if not all wafers within a wafer lot ID have been tested, branch 35, access the next wafer in the wafer lot 36, if not all wafer lot ID's have been tested, branch 37, access the next wafer lot ID, and 38, if all wafer lot ID's have been tested, the routine of the invention ends and branches back to the supervisory software such as an MIS function.

While the above highlighted program flow shows a relatively large number of entries to be made into the classification report, these entries may, in practical applications be limited to for instance the following entries:
lot number
wafer number
class number
class name
category number
category name
category type
the number of chips that are selected as being good chips with sum Y[i,j]=0
a date stamp for the indicated activities.

The following tables can be created using the method an algorithms of the invention:
1. a Chip Classification Table, see FIG. 5
2. a Wafer Classification Table, see FIG. 6
3. a Lot Classification Table, see FIG. 7.

First will be highlighted the content of the Chip Classification Table, FIG. 5.

Chips that are being tested are listed in the Chip Classification table on a per row basis, the columns of FIG. 5 represent the categories that are representative of the tests that have been performed on the chips. At the intersections of the rows and columns of FIG. 5 is shown the weight point for that category (or test, performed on the chip of the row of the intersect) that has been calculated using the above highlighted algorithms of the invention. The number of columns has been limited in FIG. 5 for considerations of brevity, the next to the last or right-most column of FIG. 5 shows the summarized values of all the weight points for each chips that have been calculated. For instance, the first entry into the next to the last or right-most column of FIG. 5 equals 21 which is the sum of 0+2+5+11+3+0+0+0 . . . 0. The latter numbers being the values of the weight points for each of the categories or types of tests that have been applied to chip number 1. The last column of FIG. 5 shows the class that has been assigned to the various chips based on the sum of the weight points, these classes have previously been identified. Considering the meaning that is implied for each of the classes that have been determined for the chips that are listed in FIG. 5, it is clear that the high quality chips, which are represented by class A, can readily be identified as can the good chips (Class B), the usable chips (Class C), etc.

It is of benefit to review the hierarchy of control parameters, as follow: a chip ID within a wafer ID, a wafer ID within a wafer lot ID, a wafer lot ID within multiple wafer lot IDs.

Figure 3:
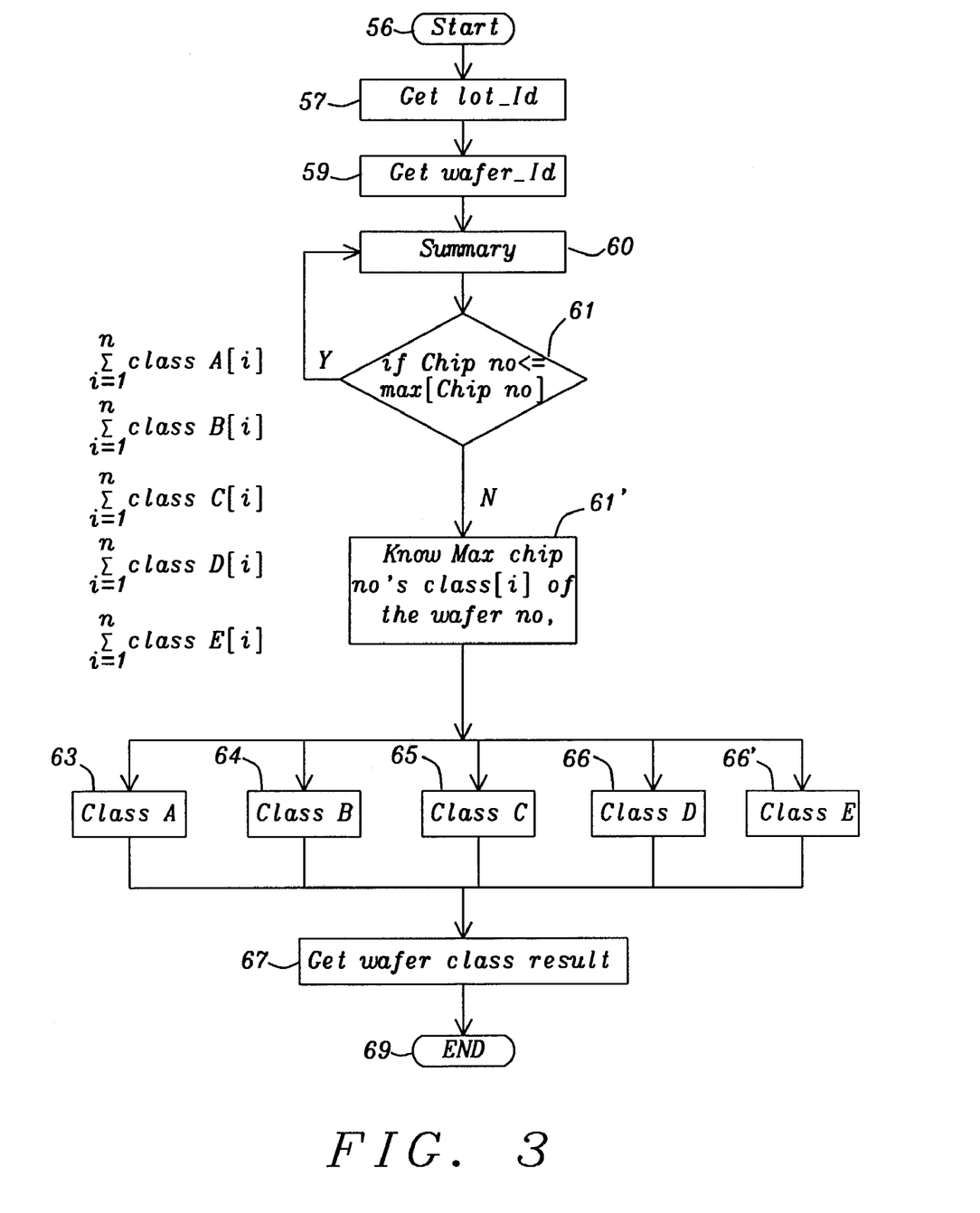
FIG. 3 shows a flowchart for the determination of the Wafer Classification table of the invention, with FIG. 6 showing a Wafer Classification table of the invention.

The correspondence between FIG. 5, the Chip Classification Table, and FIG. 3, is explained as follows and by way of example for a Chip No. 1:
1. start by getting Wafer Data (such as R6000.01)
2. get the chip's device criteria specification
3. get chip No. 1
4. get category 1
5. get upper limit (SPECHI(1)) value and lower limit (SPECLO(1)) value
6. $Y(1,1)=0$, reference the algorithm
7. get category 2
8. $Y(1,2)=2$
9. get category 3
10. $Y(1,3)=5$
11. get category 4
12. $Y(1,4)=11$
13. get category 5
14. $Y(1,5)=3$
15. get category 6
16. $Y(1,6)=0$
17. Etc.
18. Summary chip no. 1 is $0+2+5+11+3+0+0+0=21$
19. Result value 6–49 is class B
20. Chip no. 1 is assigned class B
21. End.

The correspondence between FIG. 5, the Chip Classification Table, and FIG. 3, is explained as follows and by way of example for a Chip No. 2:
1. start by getting Wafer Data (such as R6000.01)
2. get the chip's device criteria specification
3. get chip No. 2
4. get category 1
5. get upper limit (SPECHI(2)) value and lower limit (SPECLO(2)) value
6. $Y(2,1)=1$, reference the algorithm
7. get category 2
8. $Y(2,2)=0$
9. get category 3
10. $Y(2,3)=0$
11. get category 4
12. $Y(2,4)=0$
13. get category 5
14. $Y(2,5)=0$
15. get category 6
16. $Y(2,6)=1$
17. Etc.
18. Summary chip no. 2 is $1+0+0+0+0+1+0+0=2$
19. Result value 1–5 is class A
20. Chip no. 2 is assigned class A
21. End.

The correspondence between FIG. 5, the Chip Classification Table, and FIG. 3, is explained as follows and by way of example for a Chip No. 3:
1. start by getting Wafer Data (such as R6000.01)
2. get the chip's device criteria specification
3. get chip No. 3
4. get category 1
5. get upper limit (SPECHI(3)) value and lower limit (SPECLO(3)) value
6. $Y(3,1)=2$, reference the algorithm
7. get category 2
8. $Y(3,2)=4$
9. get category 3
10. $Y(3,3)=3$
11. get category 4
12. $Y(3,4)=7$
13. get category 5
14. $Y(3,5)=1$
15. get category 6
16. $Y(3,6)=0$
17. Etc.
18. Summary chip no. 3 is $2+4+3+7+1+0+1+2+2=20$
19. Result value 6–49 is class B
20. Chip no. 3 is assigned class B
21. End.

Next will be highlighted the content of the Wafer Classification table, FIG. 6. The above highlighted selection and classification of chip testing results can further be applied to the classification of a wafer. This by calculating the relative number of the classes of the chips that have been created over the surface of the wafer, as highlighted above for the Chip Classification report, FIG. 5. This wafer classification table, an example of which is shown in FIG. 6, can take the following form:

a number of wafers is selected or assigned for classification, each wafer in a wafer classification table being represented by entries of one row in the table a column within the wafer classification table represents a chip, multiple columns within the wafer classification report represent multiple chips contained over the surface of the wafer in the intersection of the rows (wafer) and columns (chips) can be entered the class of the respective chips, that is the entry in the right-most column of FIG. 5, for one wafer (row in the wafer classification table). There can be for instance respective entries of B, A, A, B, B, C, B, etc. for chips 1 through 7 etc. that are contained within wafer 1 of the first row of the wafer classification table the entries B, A, A, B, B, C, B, etc., B (the wafer 1 shown in the first row of FIG. 6) can then be quantified for relative frequency or presence within a wafer, that is for relative occurrence of a chip having a particular class within a wafer. For instance A: 63%, B: 12%, C: 9% and D: 11% for wafer 1 of the example shown in FIG. 6. This provides an indication of the performance of the chips created over the surface of each wafer based on the indicated quantification, the wafer can now be designated as wafer of class A, B, etc. based on the predominance of the classes of the chips that are contained within the wafer. For instance, in the example cited above, wafer 1 is classified as being a class A wafer since class A is the predominant class of chips that have been identified for this wafer 1.

The wafer classification table, FIG. 6, whereby the wafer is assigned a class C[i] such as class A, B, etc. is based on the following equation:

$C[i]=$maximum $[(\Sigma$ class $A[i]), (\Sigma$ class $B[i]), (\Sigma$ class $C[i]), (\Sigma$ class $D[i])]*100\%$, whereby the summation variable is the variable "n" which varies from "1" through "n" whereby "n" represents the maximum numbers of wafers that is being classified, the variable "i" is the wafer number and the entity C[i] is the classification result by wafer.

The correlation between the Wafer Classification table, FIG. 6, and the flowchart shown in FIG. 4 can be highlighted as follows by following an example of wafers no. 1 through no. 3

Wafer No. 1:
1. start by getting lot ID data, such as R6000.01
2. get wafer ID data, such as R60001.01
3. calculate the summary of all chips of the wafer's class data
4. when loop to last chip number, get the maximum chip class data of the wafer (such as class A equals 63%)
5. wafer No. 1 is assigned class A
6. end.

Wafer No. 2:
1. start by getting lot ID data, such as R6000.01
2. get wafer ID data, such as R60001.02
3. calculate the summary of all chips of the wafer's class data
4. when loop to last chip number, get the maximum chip class data of the wafer (such as class B equals 62%)
5. wafer No. 2 is assigned class B
6. end.

Wafer No. 3:
1. start by getting lot ID data, such as R6000.01
2. get wafer ID data, such as R60001.03
3. calculate the summary of all chips of the wafer's class data
4. when loop to last chip number, get the maximum chip class data of the wafer (such as class A equals 55%)
5. wafer No. 1 is assigned class A
6. end.

Next will be highlighted the content of the Lot Classification Table, FIG. 7. A lot classification can be applied, creating a lot classification report as shown in the example of FIG. 7. A number of lots are identified as being part of lot classification, each lot being represented with one row in the lot classification report. Columns of the lot classification report represent wafers whereby at the intersection of the row (a lot) and the column (a wafer) the wafer classification is entered, that is the entries of the last or right-most column of the Wafer Classification FIG. 6. For each of the wafers that is part of a lot, the previously determined Class assignment of the chips contained within the wafer is carried over (not shown individually in FIG. 7). The carry-over values of the Class A, Class B, etc. chips that are contained in the wafers belonging to one lot number are then added. This addition is shown in the Summary by Chip Number columns of FIG. 7, whereby for instance the number 463 indicates that in lot 1 a total of 463 Class A chips are identified. Based on the relative values of the classes of the chips contained in the wafers that belong to one lot number, the lot is then designated as being an "A" class lot, a "B" class lot, etc. For instance, the third row in FIG. 7, representing lot 3, has a majority of 364 class B chips from which results that lot 3 is designated as being a class C type lot, as shown in the entries of the row for lot 3.

The lot classification report uses the following equations to derive the entries thereto, these equations using variables "i" to represent the chip number, "n" is the maximum number of chips, "j" is the wafer number, "m" is the maximum number of wafers:

Summary of class A=Σ wafer[j], with the variable "j" varying from j=1 through j=m, whereby wafer[j]=(Σ class A[i]/total die), with the variable "i" varying from i=1 through i=n.

Summary of class B=Σ wafer[j], with the variable "j" varying from j=1 through j=m, whereby wafer[j]=(Σ class B[i]/total die), with the variable "i" varying from i=1 through i=n.

Summary of class C=Σ wafer[j], with the variable "j" varying from j=1 through j=m, whereby wafer[j]=(Σ class C[i]/total die), with the variable "i" varying from i=1 through i=n.

Summary of class D=Σ wafer[j], with the variable "j" varying from j=1 through j=m, whereby wafer[j]=(Σ class D[i]/total die), with the variable "i" varying from i=1 through i=n.

The correlation between the lot classification table, FIG. 7, and the flow chart of FIG. 4 can be highlighted as follows:

1. step 1: the wafer classification result:
lot 1 class A wafers=13
  class B wafers=5
  class C wafers=6
  class D wafers=1
lot 3 class A wafers=8
  class B wafers=12
  class C wafers=4
  class D wafers=1
lot 4 class A wafers=5
  class B wafers=6
  class C wafers=10
  class D wafers=4

2. step 2: split the wafers by different lot class:
lot 1 split class B wafers=5
  class C wafers=6
  class D wafers=1
lot 3 split class A wafers=8
  class C wafers=4
  class D wafers=1
lot 4 split class A wafers=5
  class C wafers=6
  class D wafers=4

3. Step 3: combine the wafers of same class:
lot 1 combine Lot 3 class A wafers=12
lot 3 combine Lot 1 class B wafers=5
  Lot 4 class B wafers=6
lot 4 combine Lot 1 class C wafers=6
  Lot 4 class C wafers=4

4. Step 4: get lot No. class and summary of the chip report:
lot 1 class A wafers=25 piece wafer
  Class A chip number=463
  Class B chip number=201
  Class C chip number=53
  Class D chip number=17
lot 3 class B wafers=23 piece wafer
  Class A chip number=23
  Class B chip number=364
  Class C chip number=51
  Class D chip number=47
lot 4 class C wafers=20 piece wafer
  Class A chip number=17
  Class B chip number=21
  Class C chip number=213
  Class D chip number=14.

Figure 2:
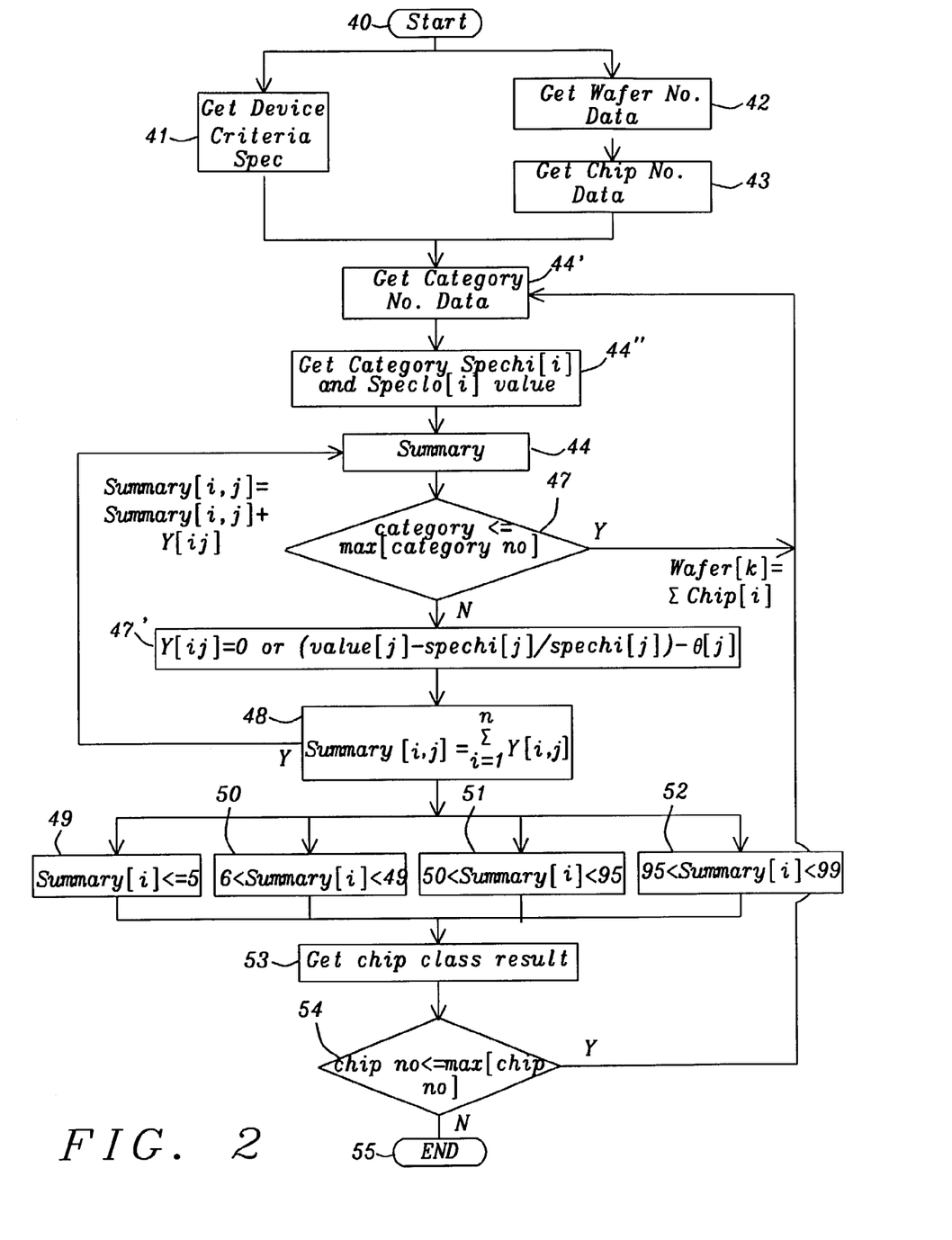
FIG. 2 shows a flowchart for the determination of the Chip Classification Table of the invention, with FIG. 5 showing a Chip Classification table of the invention.
Figure 4:
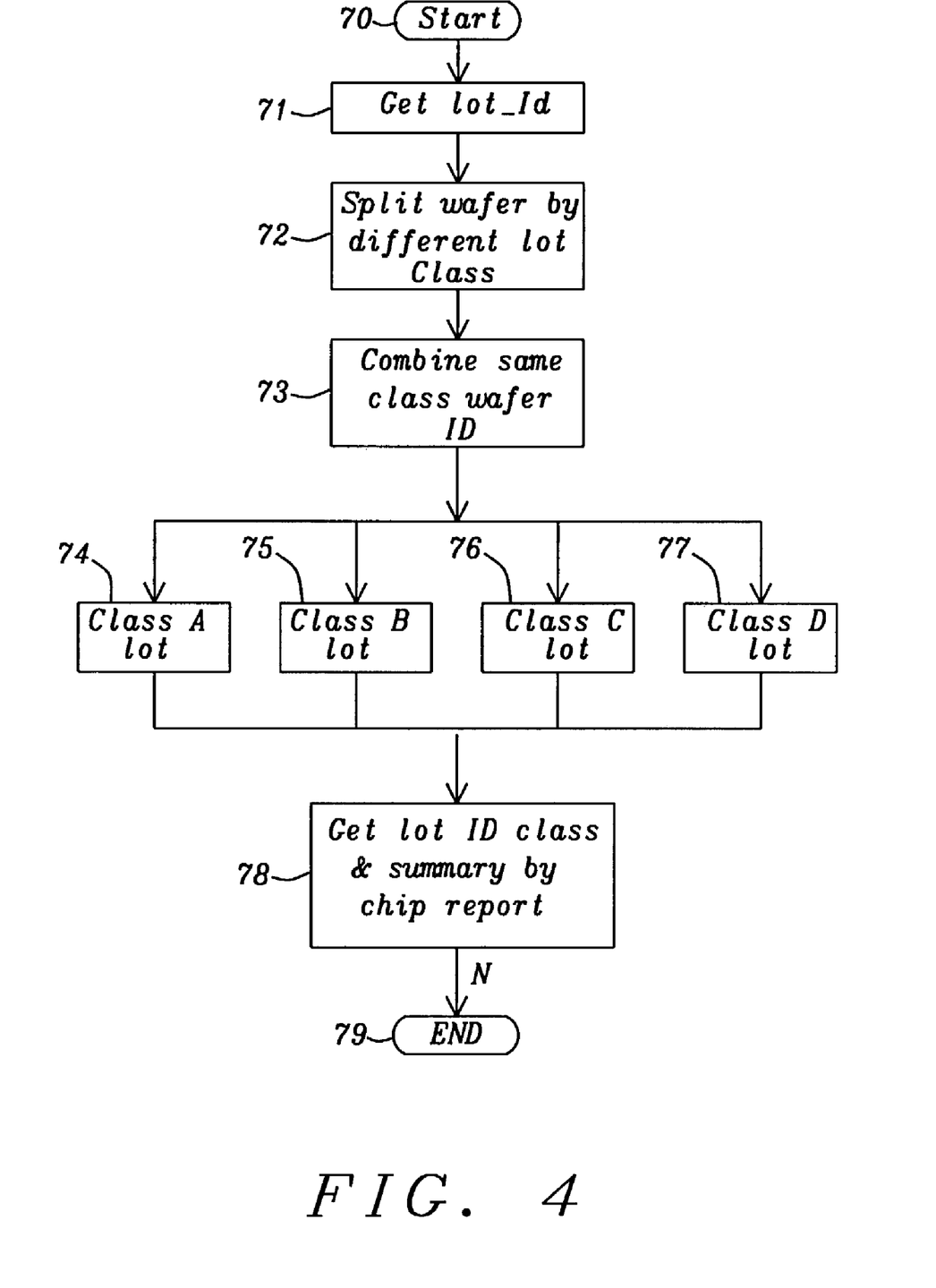
FIG. 4 shows a flowchart for the determination of the Lot Classification table of the invention, with FIG. 7 showing a Lot Classification table of the invention.

The software routines that are used to perform the chip, wafer and lot classification that have been highlighted above using Tables 1 through 3, are now described using flowcharts in FIGS. 2 through 4.

Referring first to the flowchart that is shown in FIG. 2, the following functional aspects of the Chip Flow Classification are highlighted:

40, the Chip flow Classification software routine is invoked, typically by means of a supervisory call from a program or system such as an MIS package 41, the chip testing criteria are accessed, all routines of access typically have access a data base that may be under control of a MIS system and where all relevant chip data and the like are stored; specifically accessed are the upper and lower limits of the device test parameters 42, access the wafer data, specifically get a (wait processing) wafer serial number 43, access the data that describe a category, specifically access a (wait processing) chip serial number 41', get the test function and the test parameters 44'', get the upper and lower values of the category 44, enter relevant information relating to wafer and device into a report or table, summarize the result calculation value by category number, loop until the last category number of the chip has been processed 47 have all tests been performed or, in other words, have all categories been exhausted; for testing that is not complete, the program branches back 47', follow the algorithm pseudo code method to obtain the category result 48, for completed chip testing, a summary of the weight points is created, the summary result of all categories by chip are obtained 49–52, classes A, B, C and D are assigned to the chips based on the summary of the weight points 53, the classes assigned to the chips are accessed and entered into a chip flow classification table or report; it is known to which class a chip belongs by the summary result value 54, if more chips need to be tested, the program branches back to function 44, the do loop is continued until the last chip number on the wafer has been processed, and 55, after all chips have been tested, the program ends by branching back to its supervisory function.

Referring now to the flow diagram that is shown in FIG. 3, there are highlighted the following program functions for the creation of a wafer flow classification:

56, the wafer flow Classification software routine is invoked, typically by means of a supervisory call from a program or system such as an MIS package 57, lot ID information is accessed of the lot to which the wafer is assigned, the (wait processing) lot ID serial number is obtained 57', the (wait processing) wafer serial number is obtained 58, enter relevant information relating to wafer and device into a report or table, the summary result value of all chip class data of the wafer is created 61, if not all the chips on the wafer have been processed, the program branches back and continues processing chips, the do loop is continues until the last chip number of the wafer has been processed 63–66, 66', create the summary of the classes by class type 67, access the known wafer class results, and 69, if all wafers have been processed, the program terminates by branching back to its supervisory routine.

Referring now specifically to the flowchart that is shown in FIG. 4, a flowchart that addresses the lot classification processing, the following functional entities have been highlighted:

70, the lot flow Classification software routine is invoked, typically by means of a supervisory call from a program or system such as an MIS package 71, a lot ID number is accessed 72, the lot is split to combine the same class wafers 73, the same class wafers are combined 74–77, the total number of chips that belong to the various classes in determined 78, the summary by chip entries of the lot classification table is created; the same class wafers are combined, it is known to which class a lot belongs, and 79, the program terminates processing by branching back to its supervisory routine.

Referring back to the flowchart that is shown in FIG. 1, this flowchart represents the Wafer Acceptance Testing (WAT) whereby all chips that are created over the surface of a wafer are tested. This testing does not necessarily have to create a multiplicity of classes such as classes A, B, C and D and a reject class E but can be performed such that the chips are tested for falling within limits, being therefore acceptable chips, or chips that do not meet limits, being therefore reject chips. In such an environment of chip testing, the number of classes is limited to two for either pass or fail.

Again referring back to the flowchart of FIG. 1, it must be realized that within this flowchart is comprised the test mode of Chip Probe (CP) whereby not all chips of the wafer are tested but only selected chips are tested. This latter statement is realized by entering the flow chart of FIG. 1 at block 18, where a chip is selected for testing, and exiting the flowchart after block 32 has been completed, that is after all chips have been tested even though in this instance the number of chips that are tested is a (relatively small) subset of all the chips created over the surface of the wafer.

As an outflow of the classification methods that have been described above, it must be realized that these methods provide for the sorting of chips into a number of different lots whereby for instance a "parent lot" can be designated as being a lot in which all class A type chips are sorted, a "first child lot" can comprises all class B type chips, etc.

To summarize the invention, the invention provides for:
classifying chips into categories that reflect the performance of these chips with for instance excellent (performing) chips being allotted to a first lot, good (performing) chips being allotted to a second lot, chips that are usable in a first application can be assigned to a third lot and chips that are usable in a second application can be assigned to a fourth lot while all rejected chips are assigned to a reject lot (or output bin)

there is no limitation imposed by the invention on the numbers of classes that chips that are being tested can be divided into; by dividing the test specification into smaller increments, whereby the measured value can be compared against these smaller increments, additional classes of chips can be created, and the invention is further not limited to testing and classifying DRAM chip only but can readily be extended to any chip that is produced in a semiconductor foundry; at no time during the explanation of the invention has a restriction of DRAM devices only been applied.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for sorting semiconductor devices in support of an Automatic Classification Shipping function, comprising the steps of:

entering user requirements into a supporting data base storage;

entering wafer and chip logistics data into the supporting data base storage, said logistics data being required for control of wafer and chip product flow;

entering a chip testing data into the supporting data base storage, thereby including test criteria, said test criteria being divided into a range of acceptable test result values, said range of acceptable test result values having a high limit value and a low limit value, said chip test criteria further comprising a biasing parameter;

positioning said chip in a chip tester device to perform at least one test on said chip, thereby obtaining a test result;

calculating at least one weight point for said at least one test, said calculation being based on comparing said test result with said high limit value or said low limit value;

providing at least two chip classes; dividing said at least one chip class into at least one multiple chip class.

2. The method of claim 1, said user requirements comprising:
wafer lot number or Identification Number (ID);
wafer number or Identification Number (ID) within wafer lot number;
at least one chip class number;
at least one chip class name;
at least one category number; and
at least one category name.

3. The method of claim 1, said chip logistics data comprising:
wafer routing data; and chip location data within wafer number.

4. The method of claim 1, said high limit value being "spechi", said low limit value being "speclo", said test result being "value", said biasing parameter being $\Theta$, said weight point being "Y", calculating a weight point "Y" comprising:
calculating Y=|("value"−"speclo")/"speclo"|−$\Theta$ for condition of "value"≦"speclo"; or
calculating Y=0 for condition of "speclo"≦"value"≦"spechi"; or
calculating Y=|("value"−"spechi")/"spechi"|−$\Theta$ for condition of "value">"spechi".

5. The method of claim 1, said dividing said at least one chip class into at least one multiple chip class comprising sorting said at least one chip class in numerically incrementing values.

6. The method of claim 1, said chips comprising DRAM devices.

7. The method of claim 1, additionally adding said calculated at least one weight point "Y" for said at least one test, creating at least one chip class.

8. A method of sorting a number "m" semiconductor chips created over the surface of one wafer having a wafer Identification Number (wafer ID) into a number "c" classes by performing a number "n" tests per chip, said semiconductor chips being designated by a variable "i" having a range from "1" through "m", said classes being designated by a variable "k" having a range from "1" through "c", said tests being designated by a variable "j" having a range from "1" through "n", comprising steps of:
branching into a software routine written in support of said method of sorting "m" semiconductor chips from a supervisory routine;
entering user requirements into a supporting data base storage, said user requirements comprising a value for "m", a value for "j" and a value for "k";

entering wafer ID and chip ID logistics data into a supporting data base storage, said logistics data being required for control of product flow of said wafer ID and "m" chips having a chip ID created over the surface thereof;

entering chip testing data for testing of "m" chips into a supporting data base storage, thereby including test criteria, said test criteria being divided into a range of acceptable test result values, said range of acceptable test result values having a high limit value and a low limit value for each test "j" performed on chip "i";

positioning said wafer in a chip tester device;
setting "i" equal to "1";
setting "j" equal to "1";
providing said chip tester device with said testing data for said chip "i";
performing test "j" on said chip, thereby obtaining test result value;
calculating an "j"$^{th}$ weight point for said test "j" based on said comparing said test result value with said spec high limit value and said spec low limit value;
incrementing "j" by the numeric value of "1";
evaluating a value of "j", for:
(i) "j"≦"n", resume processing of performing test "j" on said chip, thereby obtaining test result value for test "j";
(ii) for "j">"n":
summarizing "j"$^{th}$ weight points with "j" varying from "1" through "j";
subtracting a biasing parameter $\Theta$[j] assigned to said test "j" from said summarized "j"$^{th}$ weight points;
assigning a class C[i] to said chip "i" based on results obtained by subtracting the biasing parameter $\Theta$[j] assigned to said test "j" from said summarized "j"$^{th}$ weight points;
incrementing "i" by the numeric value of "1";
evaluating a value of "i", for:
(i) "i"≦"m", resume processing of performing test "j" on said chip, thereby obtaining test result;
(ii) for "i">"m", and:
returning to said supervisory routine by branching to said supervisory routine.

9. The method of claim 8, said user requirements comprising:
wafer lot number;
wafer number within wafer lot number;
at least one chip class number;
at least one chip class name;
at least one category number; and
at least one category name.

10. The method of claim 8, said chip logistics data comprising:
wafer routing data; and
chip location data within wafer number.

11. The method of claim 8, said test result value for each test "j" performed on chip "i" being "value[i,j]", said high limit value for each test "j" performed on chip "i" being "spechi[i,j]", said a low limit value for each test "j" performed on chip "i" being "speclo[i,j]", said weight point for each test "j" performed on chip "i" being Y[i,j], said calculating a weight point "Y[i,j]" for each test "j" performed on chip "i" comprising:
calculating Y[i,j]=|("value[i,j]"−"speclo[i,j]")/"speclo[i,j]"|−$\Theta$[i] for condition of "value[i,j]"≦"speclo[i,j]"; or
calculating Y[i,j]=0 for condition of "speclo[i,j]"≦"value[i,j]"≦"spechi[i,j]"; or
calculating Y[i,j]=|("value[i,j]"−"spechi[i,j]")/"spechi[i,j]"|−$\Theta$[i] for condition of "value [i,j]">"spechi[i,j]".

12. The method of claim 8, said dividing said chip class C[i] into at least one multiple chip class comprising sorting said at least one chip class in numerically incrementing values.

13. The method of claim 8, said chips comprising DRAM devices.

14. The method of claim 8, further extending this method to assigning a class designation to said wafer ID using the steps of:
determining a maximum value of said chip class C[i], creating a value of max C[i]; and
assigning said value of max C[i] to said wafer ID, creating a wafer class W[w].

15. The method of claim 14, further extending this method to assigning a class designation to a wafer lot having a lot ID, said lot ID comprising multiple said wafer ID, using the steps of:
summarizing said C[i] within a wafer ID for each value of "i", creating a sum [i];
selecting a maximum value of sum[i], creating a max sum[i]; and
assigning said max sum[i] to said lot ID.

16. A method for sorting semiconductor devices in support of an Automatic Classification Shipping function, comprising the steps of:
testing said semiconductor devices by applying a number "n" tests to said devices thereby obtaining a test result value, said testing comprising assigning a high limit value and a low limit value to device test criteria, further comprising assigning a biasing parameter;
calculating a weight point for each test based on test results obtained;
adding all calculated weight points for a semiconductor device, creating a Summary of Weight Points for a semiconductor device;
assigning a class to said semiconductor device based on said Summary of Weight Points; and
sorting said classes assigned to said semiconductor devices Summary in numerical sequence.

17. The method of claim 16, said test result value being "value", said high limit value being "spechi", said low limit value being "speclo", said biasing parameter being $\Theta$, said calculating a weight point "Y" comprising:
calculating Y=|("value"−"speclo")/"speclo"|−$\Theta$ for condition of "value"≦"speclo"; or
calculating Y=0 for condition of "speclo"≦"value"≦"spechi"; or
calculating Y=|("value"−"spechi")/"spechi"|−$\Theta$ for condition of "value">"spechi".

18. The method of claim 16, said semiconductor devices comprising DRAM devices.

19. The method of claim 16, said method being applied to sorting semiconductor devices created over the surface of one wafer.

20. The method of claim 16, said method being applied to sorting semiconductor devices created over the surface of multiple wafers.

21. The method of claim 20, said method further being extended to assigning a wafer class to individual wafers having a wafer ID of said multiple wafers, said extension comprising steps of identifying the class that is maximally assigned to semiconductor devices created over the surface of one wafer having a wafer ID and assigning this class to said wafer ID.

22. The method of claim 21, said method further being extended to assigning a lot class to individual lots having a lot ID comprising said multiple wafers, said extension comprising steps of identifying the class that is maximally assigned to wafers pertaining to said lot ID and assigning this class to said lot ID.

23. A system for sorting semiconductor devices in support of an Automatic Classification Shipping function, comprising:
means for entering user requirements into a supporting data base storage;
means for entering wafer and chip logistics data into a supporting data base storage, said logistics data being required for control of wafer and chip product flow;
means for entering chip testing data into a supporting data base storage, thereby including test criteria, said test criteria being divided into a range of acceptable test result values, said range of acceptable test result values having a high limit value and a low limit value said chip test criteria further comprising a biasing parameter;
means for positioning said chip in a chip tester device;
means for providing said chip tester device with said testing data for said chip;
means for performing at least one test on said chip, thereby obtaining a test result value;
means for calculating at least one weight point "Y" for said at least one test, said calculation being based on comparing said test result value with said high limit and said low limit; and
means for dividing said at least one chip class into at least one multiple chip class.

24. The system of claim 23, said user requirements comprising:
wafer lot number or Identification Number (ID);
wafer number or Identification Number (ID) within wafer lot number;
at least one chip class number;
at least one chip class name;
at least one category number; and
at least one category name.

25. The system of claim 23, said chip logistics data comprising:
wafer routing data; and
chip location data within wafer number.

26. The system of claim 23, said test result value being "value", said high limit being "spechi", said low limit being "speclo", said biasing parameter being $\Theta$, said means for calculating a weight point "Y" comprising:
means for calculating Y=|("value"−"speclo")/"speclo"|−$\Theta$ for condition of "value"≦"speclo"; or
means for calculating Y=0 for condition of "speclo"≦"value"≦"spechi"; or
means for calculating Y=|("value"−"spechi")/"spechi"|−$\Theta$ for condition of "value">"spechi".

27. The system of claim 23, said means for dividing said at least one chip class into at least one multiple chip class comprising means for sorting said at least one chip class in numerically incrementing values.

28. The system of claim 23, said chips comprising DRAM devices.

29. The system of claim 23, additionally comprising means for adding said calculated at least one weight point "Y" for said at least one test, creating at least one chip class.

30. A system of sorting a number "m" semiconductor chips created over the surface of one wafer having a wafer Identification Number (wafer ID) into a number "c" classes by performing a number "n" tests per chip, said semiconductor chips being designated by a variable "i" having a range from "1" through "m", said classes being designated by a variable "k" having a range from "1" through "c", said tests being designated by a variable "j" having a range from "1" through "n", comprising:

means for branching into a software routine written in support of said method of sorting "m" semiconductor chips from a supervisory routine;

means for entering user requirements into a supporting data base storage, said user requirements comprising a value for "m", a value for "j" and a value for "k";

means for entering wafer ID and chip ID logistics data into a supporting data base storage, said logistics data being required for control of product flow of said wafer ID and "m" chips having a chip ID created over the surface thereof;

means for entering chip testing data for testing of "m" chips into a supporting data base storage, thereby including test criteria, said test criteria being divided into a range of acceptable test result values, said range of acceptable test result values having a high limit value and a low limit value for each test "j" performed on chip "i";

means for positioning said wafer in a chip tester device;

means for setting "i" equal to "1";

means for setting "j" equal to "1";

means for providing said chip tester device with said testing data for said chip "i";

means for performing test "j" on said chip, thereby obtaining test result value;

means for calculating an "j"$^{th}$ weight point for said test "j" based on said comparing said test result value with said high limit value and said low limit value;

means for incrementing "j" by the numeric value of "1";

means for evaluating a value of "j", for:
   (i) "j"≦"n", resume processing of performing test "j" on said chip, thereby obtaining test result value;
   (ii) for "j">"n":

means for summarizing "j"$^{th}$ weight points with "j" varying from "1" through "j";

means for subtracting a biasing parameter assigned to said test "j" from said summarized "j"$^{th}$ weight points;

means for assigning a class C[i] to said chip "i" based on results obtained by subtracting the biasing parameter assigned to said test "j" from said summarized "j"$^{th}$ weight points;

means for incrementing "i" by the numeric value of "1";

means for evaluating a value of "i", for:
   (i) "i"≦"m", resume processing of performing test "j" on said chip, thereby obtaining test result value;
   (ii) for "i">"m", and:

means for returning to said supervisory routine by branching to said supervisory routine.

31. The system of claim 30, said user requirements comprising:
   wafer lot number;
   wafer number within wafer lot number;
   at least one chip class number;
   at least one chip class name;
   at least one category number; and
   at least one category name.

32. The system of claim 30, said chip logistics data comprising:
   wafer routing data; and
   chip location data within wafer number.

33. The system of claim 30, said high limit value being "spechi[i,j]" and said low limit value being "speclo[i,j] for each test "j" performed on chip "i", said biasing parameter being Θ[i], said test result value being "value[i,j]" for each test "j" performed on chip "i", said weight point for said test "j" being Y[i,j] for chip "i", said means for calculating a weight point "Y[i,j]" for each test "j" performed on chip "i", comprising:

means for calculating Y[i,j]=|("value[i,j]"−"speclo[i,j]")/"speclo[i,j]"|−Θ[i] for condition of "value[i,j]"≦"speclo[i,j]"; or means for calculating Y[i,j]=0 for condition of "speclo[i,j]"≦"value[i,j]"≦"spechi[i,j]"; or means for calculating Y[i,j]=|("value[i,j]"−"spechi[i,j]")/"spechi[i,j]"|−Θ for condition of "value[i,j]">"spechi[i,j]".

34. The system of claim 30, said means for dividing said chip class C[i] into at least one multiple chip class comprising means for sorting said at least one chip class in numerically incrementing values.

35. The system of claim 30, said chips comprising DRAM devices.

36. The system of claim 30, further extending this system to providing means for assigning a class designation to said wafer ID comprising:

means for determining a maximum value of said chip class C[i], creating a value of max C[i]; and means for assigning said value of max C[i] to said wafer ID, creating a wafer class W[w].

37. The system of claim 36, further extending this system to providing means for assigning a class designation to a wafer lot having a lot ID, said lot ID comprising multiple said wafer ID, comprising:

summarizing said C[i] within a wafer ID for each value of "i", creating a sum [i];

selecting a maximum value of sum[i], creating a max sum[i]; and assigning said max sum[i] to said lot ID.

38. A system for sorting semiconductor devices in support of an Automatic Classification Shipping function, comprising:

means for testing said semiconductor devices by applying a number "n" tests to said devices thereby obtaining a test result value, said testing comprising assigning a high limit value and a low limit value to device test criteria, further comprising assigning a biasing parameter;

means for calculating a weight point Y for each test based on test results obtained;

means for adding all calculated weight points for a semiconductor device, creating a Summary of Weight Points for a semiconductor device;

means for assigning a class to said semiconductor device based on said Summary of Weight Points; and sorting said classes assigned to said semiconductor devices Summary in numerical sequence.

39. The system of claim 38, said high limit value being "spechi" and said low limit value being "speclo" for each test "j" performed on chip "i", said biasing parameter being Θ[i], said test result value being "value" for each test "j" performed on chip "i", said weight point being Y, said means for calculating a weight point comprising:

means for calculating Y=|("value"−"speclo")/"speclo"|−Θ for condition of "value"≦"speclo"; or means for calculating Y=0 for condition of "speclo"≦"value"≦"spechi"; or means for calculating Y=|("value"−"spechi")/"spechi"|−Θ for condition of "value">"spechi".

40. The system of claim 38, said semiconductor devices comprising DRAM devices.

41. The system of claim 38, said system being applied to sorting semiconductor devices created over the surface of one wafer.

42. The system of claim 38, said system being applied to sorting semiconductor devices created over the surface of multiple wafers.

43. The system of claim 42, said system further being extended to providing means for assigning a wafer class to individual wafers having a wafer ID of said multiple wafers, said extension comprising providing means for identifying the class that is maximally assigned to semiconductor devices created over the surface of one wafer having a wafer ID and providing means for assigning this class to said wafer ID.

44. The system of claim 43, said system further being extended to providing means for assigning a lot class to individual lots having a lot ID comprising said multiple wafers, said extension comprising means for identifying the class that is maximally assigned to wafers pertaining to said lot ID and providing means for assigning this class to said lot ID.

* * * * *